United States Patent [19]
Takahashi et al.

[11] Patent Number: 5,021,865
[45] Date of Patent: Jun. 4, 1991

[54] LEAD FRAME FOR SEMICONDUCTOR DEVICE

[75] Inventors: Yoshiharu Takahashi; Shuichi Osaka, both of Hyogo, Japan

[73] Assignee: Mitsubishi Denki Kabushiki Kaisha, Tokyo, Japan

[21] Appl. No.: 403,963

[22] Filed: Sep. 7, 1989

[30] Foreign Application Priority Data

Sep. 8, 1988 [JP] Japan .................... 63-225380

[51] Int. Cl.$^5$ .................... H01L 23/48; H01L 23/12
[52] U.S. Cl. .................... 357/70; 357/68
[58] Field of Search .................... 357/70, 68; 174/52.4

[56] References Cited

U.S. PATENT DOCUMENTS

| | | | |
|---|---|---|---|
| 4,258,381 | 3/1981 | Inaba | 357/70 |
| 4,797,726 | 1/1989 | Manabe | 357/70 |
| 4,918,511 | 4/1990 | Brown | 357/81 |
| 4,952,999 | 8/1990 | Robinson et al. | 357/70 |

Primary Examiner—Rolf Hille
Assistant Examiner—S. V. Clark
Attorney, Agent, or Firm—Lowe, Price, LeBlanc and Becker

[57] ABSTRACT

A lead frame of a package cast from mold resin is composed of a die bond pad section on which a semiconductor chip is placed and connected to a plurality of leads placed around the die bond pad section. The die bond pad section is formed of a length of an elongated material of a reduced width, i.e., having a line-like form disposed as a pattern in the form of a Peano curve. The die bond pad section has one or a plurality of such supporting sections integrally connected to and supported by one or more extension lead or leads. The die bond pad section formed by the elongated material has a low stiffness, and thus serves to prevent cracks from being formed in the package or in the semiconductor ship due to thermal contraction effects.

10 Claims, 8 Drawing Sheets

LEAD FRAME FOR SEMICONDUCTOR DEVICE

BACKGROUND OF THE INVENTION

1. Field of the Invention

This invention relates to a lead frame for a semiconductor device and, more particularly, to a construction of die bond pad section of a lead frame employed in, and particularly suitable for all, a resin sealing type semiconductor device.

2. Description of the Background Art

Figure 15:
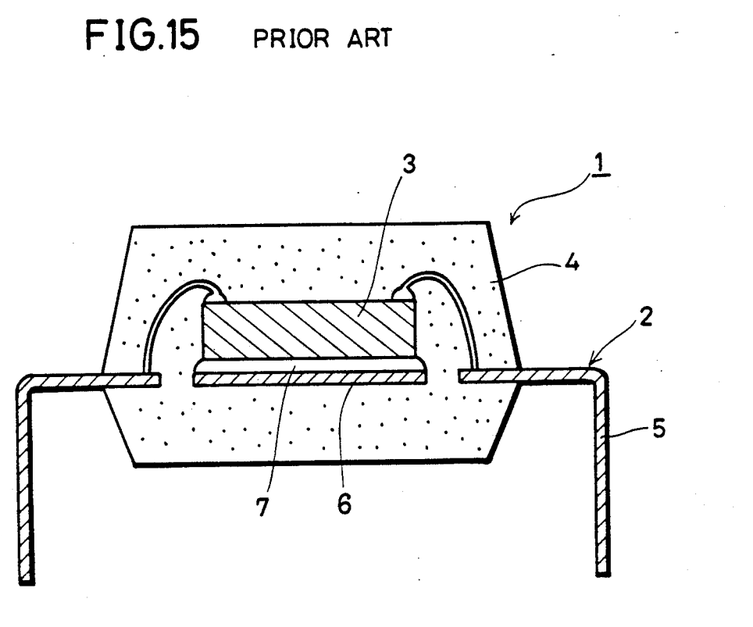
FIG. 15 is a cross-section view showing a general cross sectional structure of a resin mold semiconductor device.

A semiconductor chip in which semiconductor integrated circuitry is formed on a silicon substrate is usually sealed in a package. FIG. 15 show the cross section of the conventional resin sealing type semiconductor device. Referring to FIG. 15, the resin mold type semiconductor device 1 includes a lead frame 2, semiconductor chip 3 and a mold resin material 4. The lead frame 2 includes a plurality of leads 5 extending outwardly of the mold resin material 4 and a die bond pad section 6 on the upper surface of which the semiconductor chip 3 is placed and secured.

The resin mold type semiconductor device 1 is produced by the following process.

A die bond material 7, such as solder, is placed on the surface of the die bond pad section 6 of the lead frame 2. The semiconductor chip 3 is then placed on the surface of this die bond material 7 and maintained under a high temperature atmosphere of about 320° C. for melting the die bond material 7. After cooling, the semiconductor chip 3 is secured on the die bond pad section 6 of the lead frame 2.

The semiconductor chip 3 and a lead 5 of the lead frame 2 are connected together by wire bonding which is performed by thermal compression bonding at the temperature of approximately 250° with or without the aid of ultrasonic waves.

A mold resin material is then cast about the lead frame 2 to which the semiconductor chip is secured and connected. The molding is performed at the temperature of 220° C. to 250° C. to produce an assembly shown in FIG. 15. The assembly is then allowed to cool.

Figure 14:
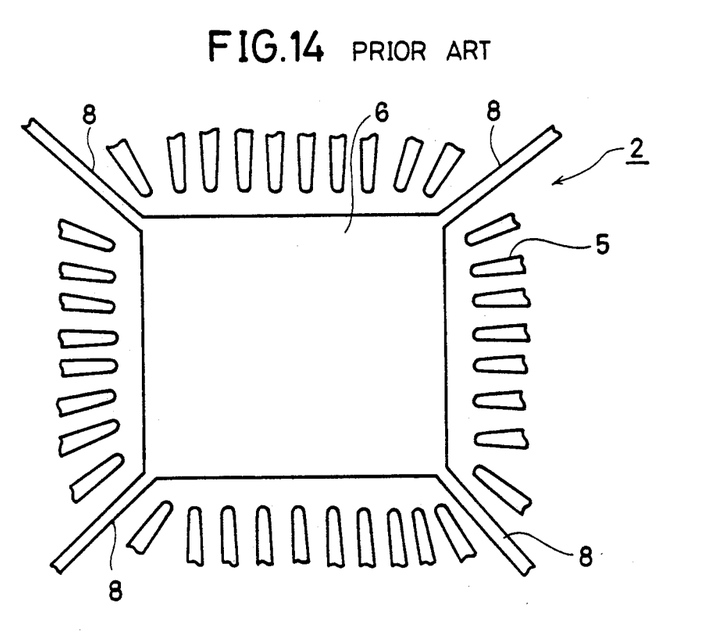
FIG. 14 is a plan view showing the vicinity of the die bond pad section of a conventional lead frame for a semiconductor device.

In the conventional resin mold type semiconductor device, problems are presented by the adverse effects of thermal strain or distortion caused by temperature hysteresis since the time of manufacture until completion. The die bond pad section 6 of the lead frame formed of copper, iron or alloy is formed as a rectangular flat plate as shown in FIG. 14. This die bond pad section 6 tends to contract when cooled from a temperature of 320° C. encountered during the die bond process of the semiconductor chip 3 down to the ambient temperature. On the other hand, the mold resin material 4 is a thermo setting resin, such as epoxy resin, and it tends to contract when cooled from the temperature of 200° C. to 250° C. during the mold casting up to the ambient temperature. These two materials are different from each other and, moreover, experience different contractions due to cooling temperature. Thus the die bond pad section 6 having usually a higher thermal expansion coefficient than that of the mold resin material 4 tends to undergo larger thermal contraction than the mold resin material 4. In addition, since the die bond pad section 6 exhibits a stiffness higher than that of the mold resin material 4, the thermal strain or distortion of the package as a whole is governed by the thermal contraction of the die bond pad section 6. Consequently, the semiconductor chip 3 or the mold resin material 4 may undergo thermal strain or distortion to more than an allowable extent, with the resulting inconvenience that the semiconductor chip 3 is thereby bent or subjected to cracking in the interior of the resin material 4.

SUMMARY OF THE INVENTION

An object of the present invention is to reduce the stiffness of the die bond pad section in the lead frame for a semiconductor device.

Another object of the present invention is to provide for an isotropic reduction of the stiffness of the die bond pad section of the lead frame for a semiconductor device.

Another object of the present invention is to simplify the pattern configuration of the lead frame for a semiconductor device.

Still another object of the present invention is to eliminate a suspension lead supporting the die bond pad section of the lead frame for a semiconductor device.

The lead frame for a semiconductor device according to the present invention includes a die bond pad section on the pad surface of which a semiconductor chip is placed and secured, and a lead section composed of a plurality of leads arranged about the die bond section. The die bond section is formed by an elongated material having a line form such that the semiconductor chip may be placed on the upper surface of the die bond pad section.

In another aspect of the present invention, the elongated material constituting the die bond pad section is constituted by one or a plurality of line-like independent continuous materials disposed such that the individual line do not intersect either themselves or one another.

In still another aspect of the present invention, the elongated material constituting the die bond pad section is formed as a Peano curve.

In the lead frame for a semiconductor device according to the present invention, the die bond pad section is formed by a material elongated to a line-like form; to reduce the stiffness at the die bond pad section. This reduces the force of thermal contraction transmitted by the die bond pad section to the semiconductor chip or the mold resin material under the effect of thermal contraction caused by temperature fluctuations during production. In this manner, the force of thermal contraction acting between and affecting the die bond pad section and the mold resin material may be equalized for the resin mold type package in its entirety to suppress any thermal strain or distortion caused especially in the mold resin material. This, in turn, prevents cracking in the resin material.

In still another aspect of the present invention, the elongated material constituting the die bond pad section is in the form of a Peano curve. The Peano curve represents the shape of a continuous line-like curve in terms of mathematics which is thought as completely filling the inside of a square form. By using this Peano curve, the shape of the elongated material disposed within each square unit region may be analogous or congruent for the overall surface of the die bond pad section. In this manner, contact surface regions between the die bond pad section and the reverse surface of the semiconductor chip may be uniformly set for the overall surface of the die bond pad section, while the stiffness of the die bond pad section may thereby be uniformly reduced. This prevents local stress concentration when thermal contraction occurs during the production process. Also the above shape of the die bond pad section facilitates transport of the lead frame during the die bonding by that the reverse surface of the semiconductor chip is supported uniformly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

By referring to the drawings, illustrative embodiments of the present invention will be explained in detail.

Figure 1:
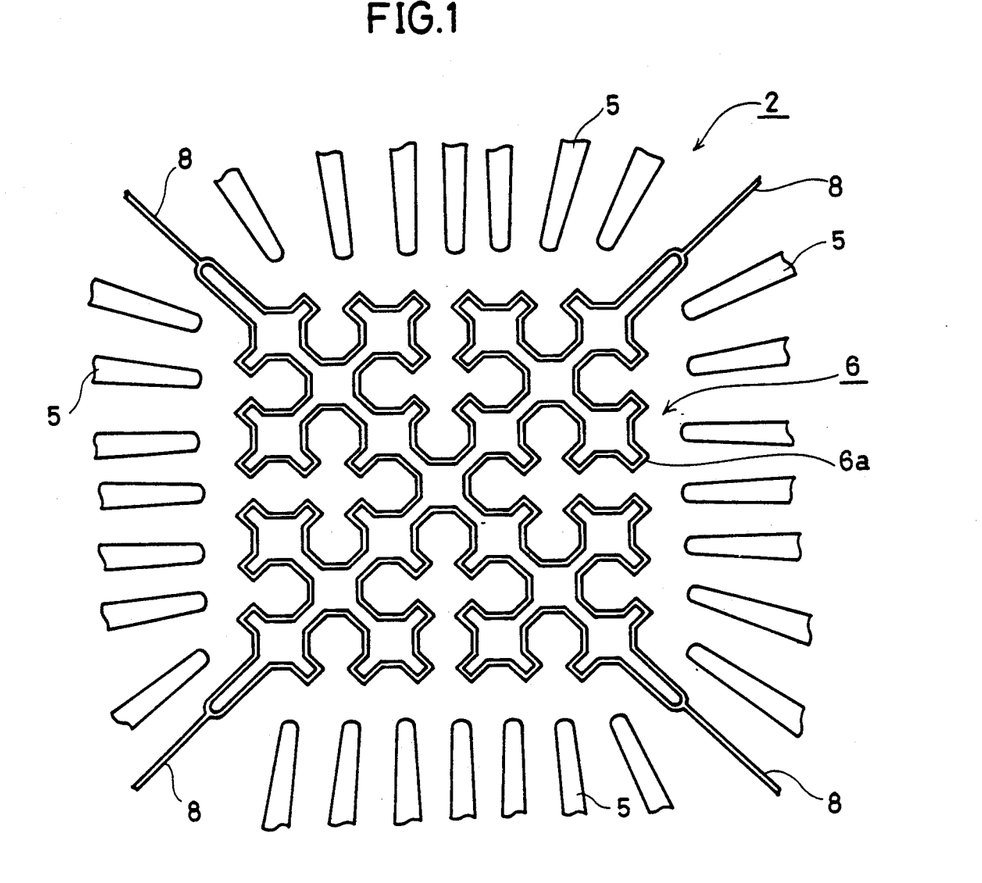
FIG. 1 is a plan view showing the vicinity of the die bond pad section of the lead frame for a semiconductor device according to an embodiment of the present invention.

Referring to FIG. 1, the lead frame 2 includes a die bond pad section 6 formed as a Peano curve and a plurality of leads 5 radially formed on the perimeter of the die bond pad section 6. The die bond pad section 6 is formed by an elongated material 6a, having, for example, a line-like form of a diameter of 0.1 mm, and formed of copper, iron or alloys thereof in the form of a Peano curve. At the four corners of the die bond pad section, extension leads 8 are formed integrally for supporting these corner portions. The elongated material 6a constituting the die bond pad section 6 in the form of the Peano curve is usually represented by an independent continuous line-like curve presenting no intended intersections i.e., the continuous line-like form does not anywhere intersect itself. When the die bond pad section 6 is divided into a plurality of square regions, the shape of a portion of the Peano curve contained in this square region is analogous or congruent for all of these square regions. In this manner, the stiffness in any two mutually perpendicular optional directions within the frame of the die bond pad section 6 may be substantially equalized to prevent local stress concentration caused by thermal strain or distortion caused in turn by temperature fluctuations during the packaging process. Such a shape of the die bond pad section 6 is also effective to provide for uniform distribution of the contact areas within the contact region between the die bond pad section and the semiconductor chip secured on the surface of the die bond pad section 6. Consequently, the function of the die bond section 6 supporting the semiconductor chip 3 uniformly from its lower surface is not impaired. This supporting function is achieved by the suspension lead 8 connected to the die bond pad section 6.

Figure 2:
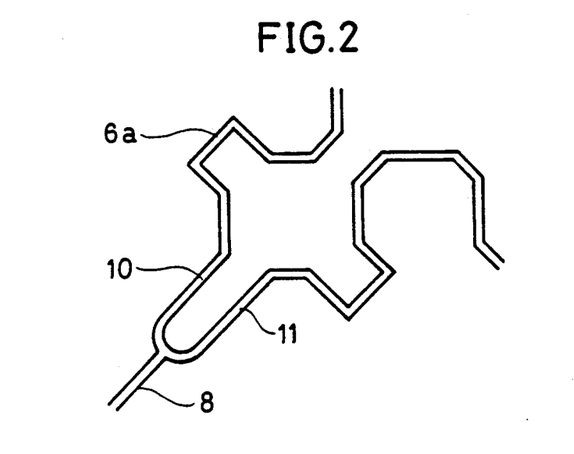
FIG. 2 is an enlarged plan view showing the connecting portion between the die bond pad section and a suspension lead.
Figure 3:
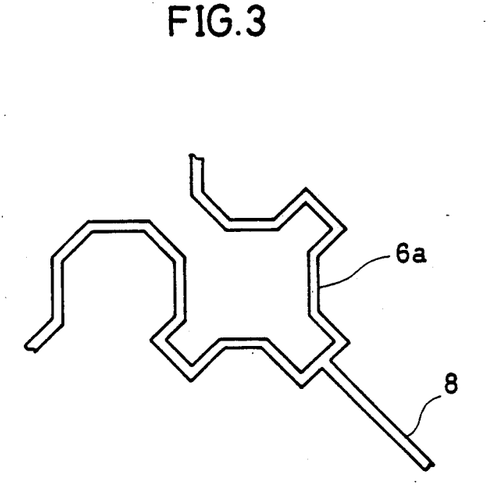
FIGS. 3 and 4 are enlarged plan views showing modified embodiments of the connecting portion between the die bond pad section and the suspension lead.
Figure 4:
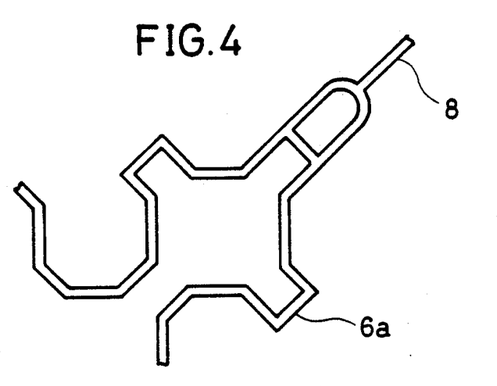

FIG. 2 is an enlarged plan view showing the connecting portions of a starting point 10 and a terminal point 11 of the Peano curve constituting the die bond pad section 6 with the suspension lead 8. The suspension lead 8 is integrally connected to the die bond pad section 6. The suspension lead 8 and the die bond pad section 6 may also be connected to each other as shown in FIGS. 3 and 4.

The closed loop portion where lead 8 joins 6a is part of the lead 8 connection and is not meant to cause the line-like Peanos curve of 6a to intersect with itself.

FIGS. 5 to 13 show modified embodiments of the present invention. One of the features common to these embodiments is that the elongated material 6a constituting the die bond pad section is connected integrally with the lead 5. This lead 5 plays the part not only of the suspension leads for supporting the die bond pad section 6, but of the lead wire proper. Thus the embodiments represent a simplified structure in which separate suspension leads are dispensed with.

Figure 5:
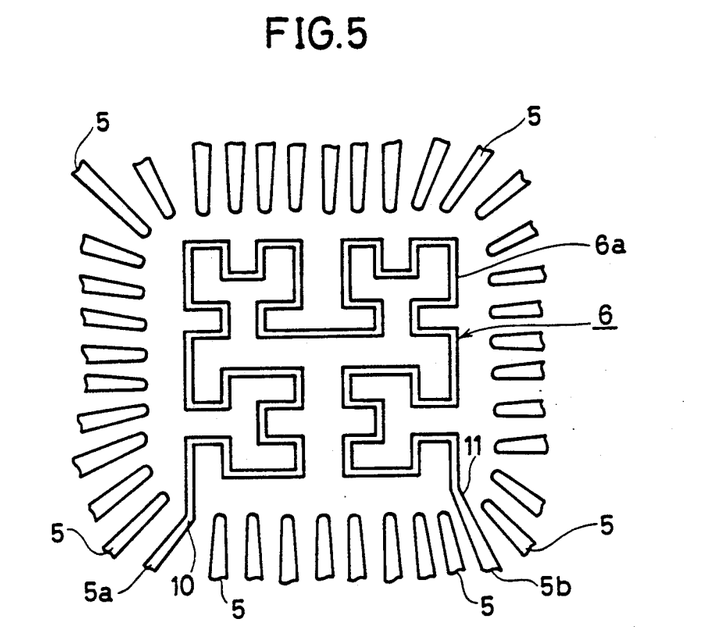
FIGS. 5, 6, 7, 8, 9, 10 11, 12 and 13 are plan views showing the vicinity of the die pad bond section and showing various modifications of the lead frame for the semiconductor device according to the present invention.

The embodiment shown in FIG. 5 is formed by a die bond pad section 6 formed by an elongated material 6a in the form of a line-like Peano curve, leads 5a, 5b connected integrally with the starting point 10 and the terminal point 11 of the continuous Peano curve and 38 pieces of independent lead 5 formed radially about the perimeter of the die bond pad section 6. The two leads 5a, 5b connected to the die bond pad section 6 function as a lead wire since they are formed of a continuous electrically conductive material.

Figure 6:
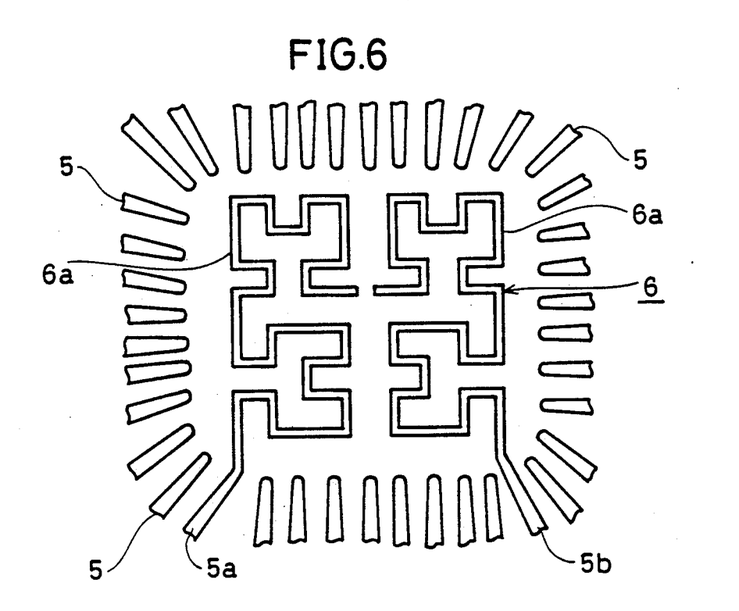

In the embodiment shown in FIG. 6, in contrast to that shown in FIG. 6, the Peano curve of the elongated material 6a constituting the die bond pad section 6 is cut and divided half way. In this manner, the leads 5a, 5b connected integrally to the two elongated materials 6a constituting the die bond pad section 6 function as separate lead wires. In the embodiment shown in FIG. 7, in contrast to the embodiment shown in FIG. 5, two additional leads 5c, 5d are connected part way along length of the line-like elongated material 6a, to intensify the support afforded by the die bond pad section 6.

Figure 7:
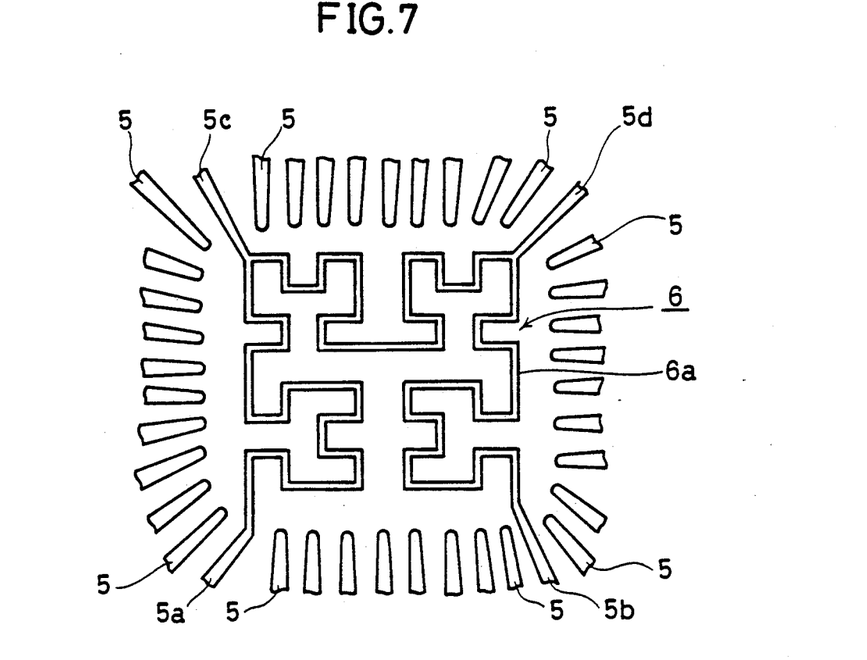
Figure 8:
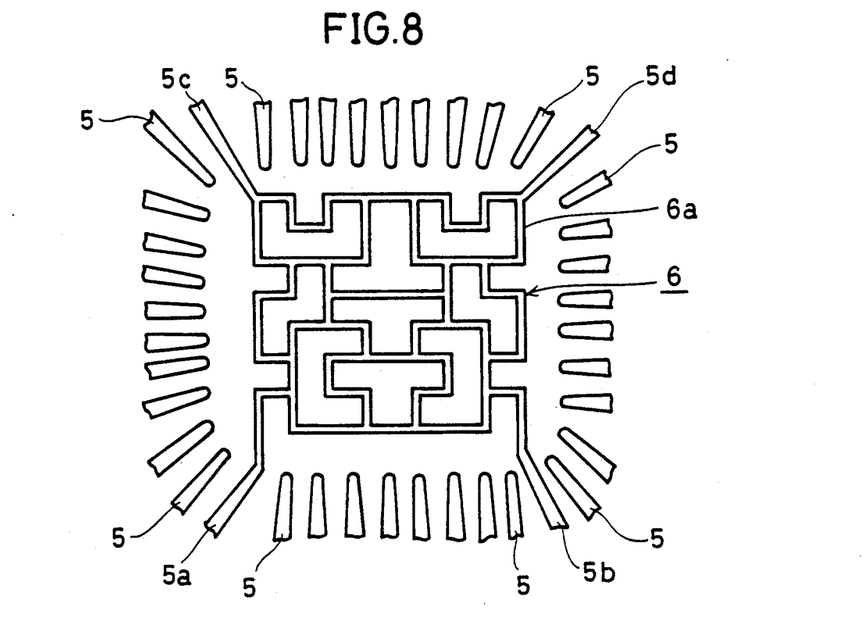

In the embodiment shown in FIG. 8, in contrast to that shown in FIG. 7, two optional points half way in the Peano curve of the elongated material 6a are connected to each other for improving the supporting strength of the elongated material 6a. Note that the line-like form of the elongated material does not cross itself, i.e., it does not intersect itself.

Figure 9:
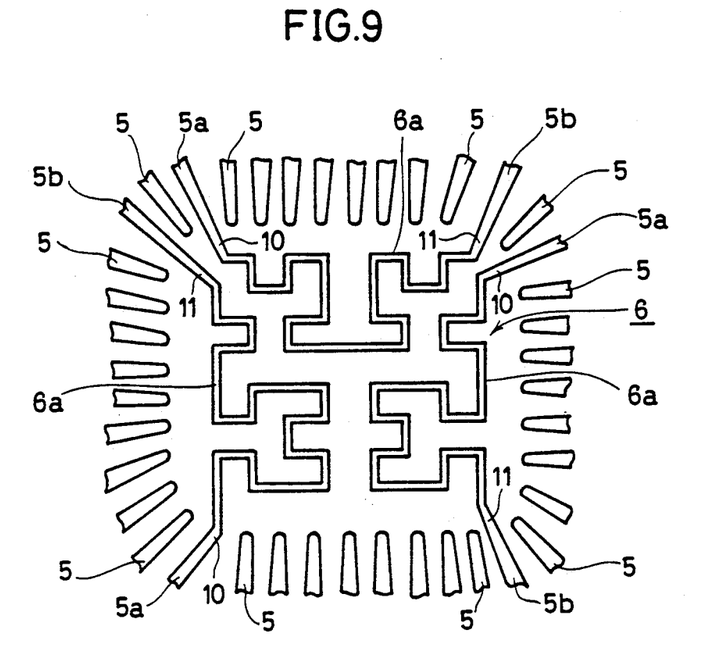

In the embodiment shown in FIG. 9, the die bond pad section 6 is formed by three lengths of elongated materials 6a, each having a form of a independent Peano curve, with the starting point and the terminal point 11 of each of the individual lengths of elongated materials 6a being integrally connected with corresponding leads 5a, 5b.

Figure 10:
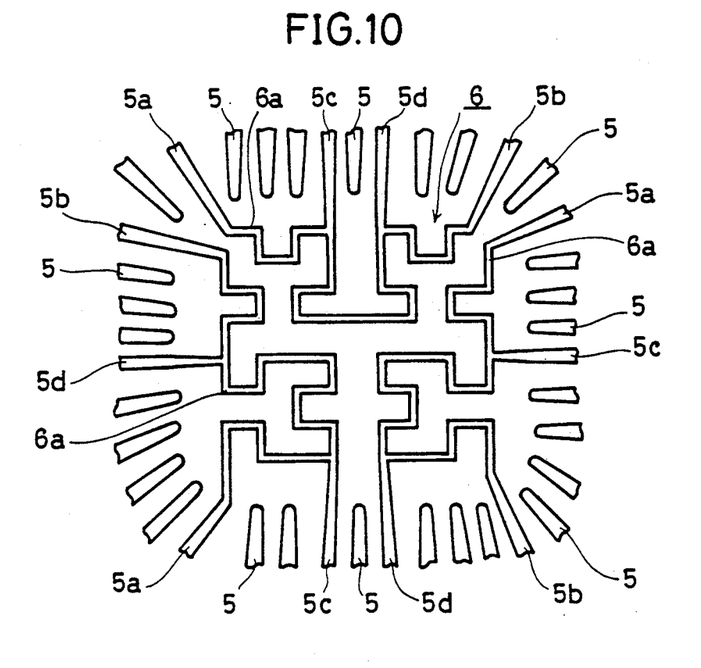

In the embodiment of FIG. 10, the Peano curve of each of the three independent elongated material 6a shown in FIG. 9 is connected to leads 5c to 5d for strengthening the supporting structure of the die bond section 6. As mentioned in the immediately preceding paragraph, none of the Peano curves crosses itself or any of the other curves.

Figure 11:
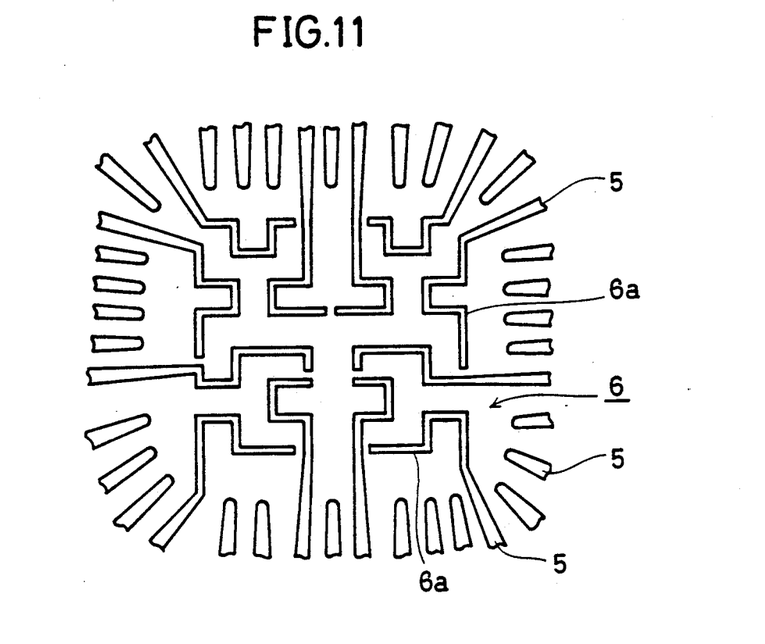

In the embodiment shown in FIG. 11, the die bond pad section 6 is constituted of a plurality of lengths of elongated materials 6a each extending from an associated lead 5 and each having an independent pricewise continuous Peano curve section. In this manner, the leads 5 formed around the die bond pad section 6 function as separate and independent leads.

Figure 12:
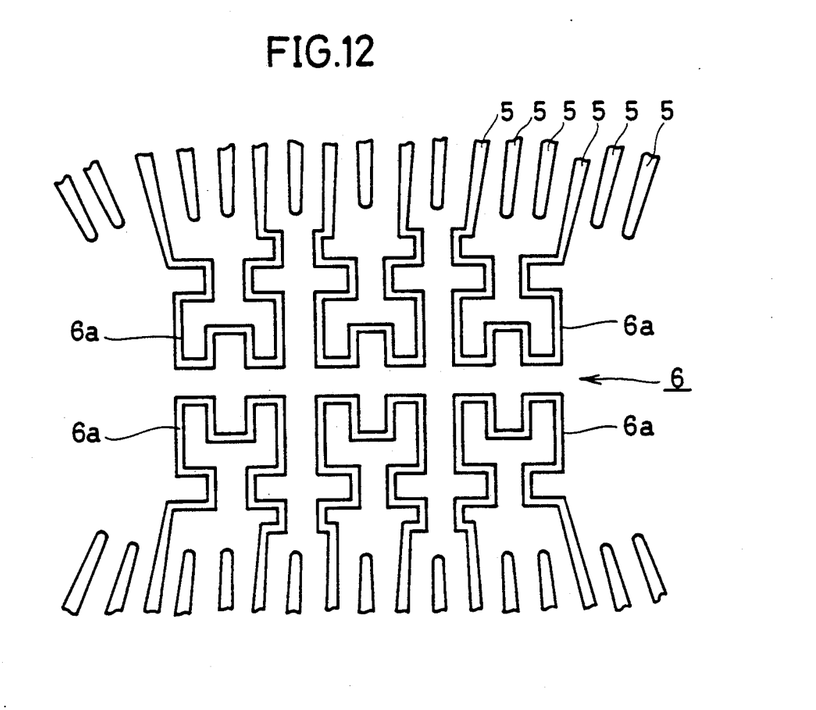

In the embodiment shown in FIG. 12, the die bond pad section 6 is formed by a parallel array of a plurality of independent elongated materials 6a each having the form of Peano curves.

Figure 13:
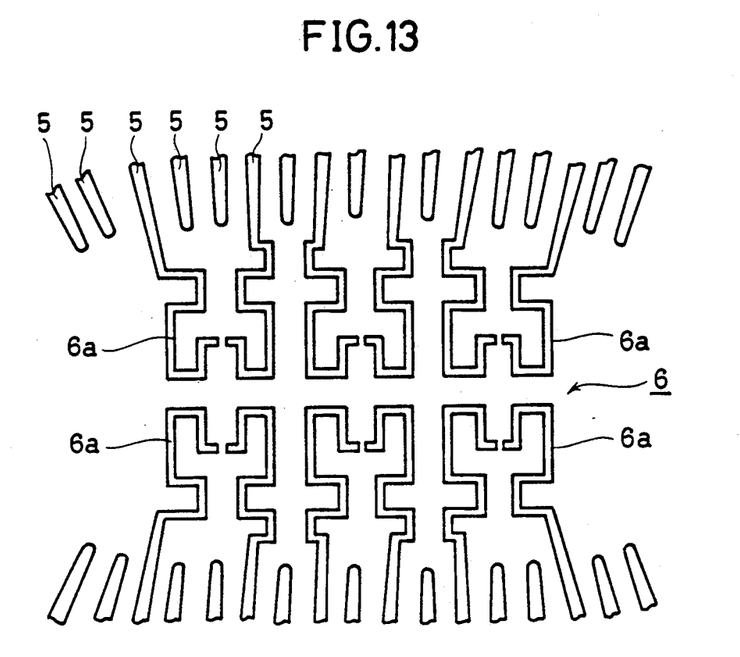

The embodiment shown in FIG. 13 is similar to that shown in FIG. 12 except that the independent elongated materials 6a are divided halfway so that the pricewise continuous lengths of elongated material 6a and a corresponding lead 5 are formed integrally.

As described hereinabove, the lead frame for a semiconductor device according to the present invention has its die bond pad section 6 formed by a pattern of elongated materials to reduce its stiffness. In this manner the stiffness of the die bond pad section 6 may be equated with that of the semiconductor chip or that of the mold resin material for the constituting the resin mold semiconductor device. In this manner, the relative thermal contraction exerted by the die bond pad section on other component elements may be reduced with respect to the thermal contraction caused by temperature fluctuations in the course of the production process. This reduces the amount of deformation of the mold resin material caused by distortion by thermal contraction of the die bond pad section 6, while preventing cracking in the mold resin material.

Also, as described in these embodiments, this die bond pad section 6 has the form of a Peano curve. Changes in the size of the semiconductor chip 3 placed on the die bond pad section 6 may be coped with by changing the size or the number of repetitions of the congruent figure of the Peano curve, thus increasing the degree of freedom available in designing the die bond pad section.

In the above-described embodiments, explanation has been provided mainly of the case of using the elongated material 6a constituting the die bond pad section 6 in the form of the Peano curve, but is this should not interpreted as limiting the present invention. Thus, the spiral or wavy form of the elongated material 6a may also be employed, if only the stiffness of the die bond pad section 6 may thereby be reduced.

It will be appreciated from the foregoing that, according to the present invention, the die bond pad section 6 of the lead frame for the semiconductor device is formed by one or more lengths of elongated materials to reduce the stiffness of the die bond pad section 6, to thereby reduce the effects of thermal contraction exerted by the die bond section on the mold resin package to prevent stress or cracking in the mold resin material for the semiconductor chip. Also the pattern of the elongated material in the form of the Peano curve enables the elongated material to be contacted with the semiconductor chip at uniformly distributed contact portions to prevent local stress concentration during production to thereby reduced damages caused to the semiconductor chip, resulting in the highly reliable resin mold semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A lead frame for a semiconductor device, comprising:

a die bond pad section on the upper surface of which a semiconductor chip is placed and secured; and a lead section including a plurality of leads arranged about said die bond pad section, wherein said die bond pad section comprises a material having a Peano curve form that is disposed over the die bond pad section such that said semiconductor chip may be placed on the upper surface of the die pad section thus provided.

2. A lead frame for a semiconductor device according to claim 1, wherein:

said Peano curve form comprises a continuous non-intersecting line-like length that does not intersect itself.

3. A lead frame for a semiconductor device according to claim 1, wherein:

said Peano curve form is integrally connected with a desired one of said leads.

4. A lead frame for a semiconductor device according to claim 1, wherein:

said Peano curve form comprises a plurality of independent continuous line-like lengths of the material each of which independent lengths is integrally connected with one of said leads, each of said independent lengths being disposed so as to not intersect either itself or any of the other independent lengths.

5. A lead frame for a semiconductor device according to claim 2, wherein:

said Peano curve form is integrally connected to a desired one of said leads.

6. A lead frame for a semiconductor device according to claim 2, wherein:

said Peano curve form comprises a plurality of independent continuous line-like lengths, each of which is integrally connected with one of said leads.

7. A lead frame for a semiconductor device according to claim 2, wherein:

said Peano curve form comprises a single continuous Peano curve, the starting and terminal points of said continuous Peano curve being respectively connected integrally with one of said leads, and each of two intermediate points on said continuous Peano curve are respectively connected integrally with another of said leads.

8. A lead frame for a semiconductor device according to claim 7, wherein:

two predetermined points on the continuous Peano curve of said elongated material are connected together by another length of elongated material in such a manner that the continuous Peano curve does not intersect itself.

9. A lead frame for a semiconductor device according to claim 2, wherein:

said Peano curve form comprises a plurality of independent continuous lengths each formed as an individual Peano curve, the starting and terminal points of each of said continuous lengths are respectively connected integrally with a corresponding one of said leads, and a selected point on the individual Peano curve of each of said continuous lengths is connected with another of said leads.

10. A lead frame for a semiconductor device according to claim 2, wherein:

said Peano curve form comprises a plurality of independent continuous lengths, and one end of each of said independent continuous lengths is integrally connected with a corresponding one of said leads.

* * * * *